(12) United States Patent
Hashinoki et al.

(10) Patent No.: US 7,563,323 B2
(45) Date of Patent: Jul. 21, 2009

(54) SUBSTRATE TREATING APPARATUS

(75) Inventors: Kenji Hashinoki, Kyoto (JP); Satoshi Yamamoto, Kyoto (JP); Yasufumi Koyama, Kyoto (JP)

(73) Assignee: Dainippon Screen Mfg. Co. Ltd. (JP)

( * ) Notice: Subject to any disclaimer, the term of this patent is extended or adjusted under 35 U.S.C. 154(b) by 305 days.

(21) Appl. No.: 10/942,180

(22) Filed: Sep. 16, 2004

(65) Prior Publication Data
US 2005/0061441 A1    Mar. 24, 2005

(30) Foreign Application Priority Data
Sep. 22, 2003    (JP)    ............... 2003-329925

(51) Int. Cl.
*B05C 11/00*    (2006.01)
*B05C 13/00*    (2006.01)
*B05C 13/02*    (2006.01)
*B05C 11/02*    (2006.01)

(52) U.S. Cl. .................. 118/66; 118/58; 118/59; 118/69; 118/52

(58) Field of Classification Search ............ 156/345.31, 156/345.32; 118/719
See application file for complete search history.

(56) References Cited

U.S. PATENT DOCUMENTS 6,403,924 B1 *    6/2002    Hayashi .............. 219/390
2002/0098458 A1 *    7/2002    Hashimoto ............. 432/247

FOREIGN PATENT DOCUMENTS

| JP | 5-178416 | 7/1993 |
| JP | 6-151293 | 5/1994 |
| JP | 8-17724 | 1/1996 |
| JP | 9-74126 | 3/1997 |
| JP | 9-74127 | 3/1997 |

* cited by examiner

*Primary Examiner*—Karla Moore
(74) *Attorney, Agent, or Firm*—Ostrolenk, Faber, Gerb & Soffen, LLP

(57) ABSTRACT

A substrate treating apparatus is capable of promptly heating substrates after exposure, and avoiding an adverse thermal influence on an exposing apparatus. A developing block includes heating modules for heating exposed substrates. An interface block is interposed between the heating modules and the exposing apparatus to isolate the exposing apparatus from the thermal influence of the heating modules. The interface block has a transport mechanism for transporting the substrates to the heating modules, whereby the exposed substrates are promptly transferred to the heating modules.

12 Claims, 10 Drawing Sheets

Fig.10

| transport steps | 1st main transport mech. | transport steps | 2nd main transport mech. | transport steps | 3rd main transport mech. | transport steps | 4th main transport mech. |
|---|---|---|---|---|---|---|---|
| 1+α | PASS1 PASS2 → | 1+α | PASS3 PASS4 → | 1+α | PASS5 PASS6 → | 1+α | PASS7 PASS8 → |
| 2 | CP → | 2 | CP → | 2+α | PASS7 PASS8 → | 2 | EEW → |
| 3 | BARC → | 3 | PR → | 3 | CP → | 3 | CP → |
| 4 | HP → | 4 | PHP → | 4 | SD → | 4+α | PASS9 PASS10 → |
| 5 | WCP → | 5 | CP → | 5 | HP → | 5 | PEB |
| 6+α | PASS3 PASS4 | 6+α | PASS5 PASS6 | 6 | WCP | | | ically amplified photoresist has been used increasingly. This photoresist requires a strict management of time from exposure to heating of the substrates, in order to maintain patterning accuracy.
SUBSTRATE TREATING APPARATUS

BACKGROUND OF THE INVENTION

(1) Field of the Invention

This invention relates to a substrate treating apparatus for performing a series of treatments of substrates such as semiconductor wafers, glass substrates for liquid crystal displays, glass substrates for photomasks, and substrates for optical disks (hereinafter called simply "substrates").

(2) Description of the Related Art

Conventionally, such a substrate treating apparatus is used, for example, in a photolithographic process for forming photoresist film on substrates, exposing the substrates having the photoresist film formed thereon, and developing the exposed substrates (see Japanese Unexamined Patent Publication No. 6-151293 (1994) (page 3 and FIGS. 1 and 2) and Japanese Unexamined Patent Publication No. 8-17724 (1996) (pages 3-4 and FIG. 1), for example).

A conventional substrate treating apparatus has substrate treating sections including a photoresist coating section and a developing section, and an interface section for transferring substrates between the substrate treating section and an exposing apparatus (stepper) which is an external apparatus. The substrates coated with a photoresist in the substrate treating section are transferred to the exposing apparatus through the interface section. The substrates having a circuit pattern printed thereon in the exposing apparatus are transferred back to the interface section. In recent years, a chemically amplified photoresist has been used increasingly. This photoresist requires a strict management of time from exposure to heating of the substrates, in order to maintain patterning accuracy. Thus, the conventional substrate treating apparatus has heating and cooling units arranged in the interface section in order to heat-treat the exposed substrates promptly. A substrate returned to the interface section from the exposing apparatus is promptly loaded into the heating unit in the interface section by a substrate transport mechanism of the interface section. The heated substrate is transported to the cooling unit in the interface section to be cooled to room temperature. The substrate having undergone a post-exposure bake (PEB) in this way is passed from the interface section to the substrate treating section, and is developed in the developing section of the substrate treating sections.

The conventional substrate treating apparatus having such a construction has the following drawback.

The conventional substrate treating apparatus has a heating unit in the interface section for a post-exposure bake. This construction has a possibility of exerting an adverse thermal influence on the exposing apparatus adjoining the interface section.

SUMMARY OF THE INVENTION

This invention has been made having regard to the state of the art noted above, and its object is to provide a substrate treating apparatus capable of performing a post-exposure bake promptly, and avoiding an adverse thermal influence on an exposing apparatus.

The above object is fulfilled, according to this invention, by a substrate treating apparatus for performing a required treatment of substrates, comprising:

a main body of the treating apparatus including a developing section for developing the substrates;

an interface section for transferring the substrates between the main body of the treating apparatus and an exposing apparatus which is an external apparatus;

a heating device for heating exposed substrates before development; and a cooling device for cooling the substrates heated by the heating device;

wherein the heating device is disposed in the main body of the treating apparatus, and the interface section includes a substrate transport mechanism for transferring the substrates to the heating device.

According to this invention, exposed substrates returned from the exposing apparatus are transferred by the substrate transport mechanism in the interface section to the heating device in the main body of the treating apparatus. The substrates heated by the heating device are transported, after being cooled by the cooling device, to the developing section to be developed therein. According to this invention, the heating device for post-exposure bake is disposed in the main body of the treating apparatus, and the interface section is interposed between the heating device and the exposing apparatus. Thus, the heating device is separated from the exposing apparatus, to avoid the adverse thermal influence of the heating device being exerted on the exposing apparatus. Further, the interface section includes a transport mechanism for transferring exposed substrates to the heating device. The substrates received from the exposing apparatus may therefore be promptly transported to and heated in the heating device. Where a substrate transport mechanism in the main body of the treating apparatus is used to transport exposed substrates to the heating device, waiting times tend to occur until the exposed substrates are passed on to the heating device since the substrate transport mechanism in the main body of the treating apparatus, generally, also bears the duty of transporting the substrates to other treating sections. Further, when some fault occurs in the main body of the treating apparatus, the substrate transport mechanism in the main body of the treating apparatus will become unavailable, and then the exposed substrates are left untreated for a long time. Such a waiting time may result in variations in the time before heating the substrates after exposure. This will lower the accuracy of patterning of the developed photoresist, or require the substrates to be reclaimed by removing photoresist film.

It is preferable in this invention that the heating device and the cooling device are arranged adjacent each other and in the main body of the treating apparatus. With this construction, the substrates heated by the heating device may be transferred promptly to the cooling device for cooling treatment. This enables a strict management of the time when the substrates are in a heated state, thereby further improving the accuracy of patterning of the photoresist.

It is still more desirable that the heating device includes a heating plate for supporting and heating the substrates, a temporary substrate deposit disposed adjacent the heating plate for holding cooled substrates, a local transport mechanism for exclusive use in transporting the substrates from the heating plate to the temporary substrate deposit, and a main transport mechanism for transporting the cooled substrates from the temporary substrate deposit to the developing section. With this construction, the substrates heated by the heating plate are transported to the temporary substrate deposit by the exclusive local transport mechanism. This enables a management, with increased strictness, of the time when the substrates remain in a heated state. Where the substrates heated by the heating plate are transported to the temporary substrate deposit by the main transport mechanism which also bears the duty of transporting the substrates to other treating sections, variations tend to occur in the waiting time before transport, thereby reducing the strictness of time management.

It is preferred in this invention that the cooling device is provided for the local transport mechanism. For example, the local transport mechanism may include a holding plate, the cooling device being provided for the holding plate. With this construction, the substrates may be cooled while being transported from the heating plate to the temporary substrate deposit. This provides an advantage of further reducing the time when the heated substrates are left untreated. Of course, the invention is not limited to such a construction. The cooling device may be provided for the temporary substrate deposit, instead.

The heating plate may be enclosed in a housing defining an opening for allowing the local transport mechanism to load and unload the substrates on/from the heating plate, the opening being located in a side remote from a side accessed by the main transport mechanism. With this construction, hot atmosphere escaping through the opening has a reduced influence on the main transport mechanism, to suppress a temperature increase of the main transport mechanism.

Preferably, the interface section includes a feed buffer for temporarily storing the substrates to be exposed, when the exposing apparatus is incapable of accepting the substrates. With this construction, when the exposing apparatus is incapable of accepting the substrates, the substrates to be exposed are temporarily stored in the feed buffer. After the exposing apparatus becomes ready to accept the substrates, the substrates stored in the feed buffer are loaded into the exposing apparatus.

The interface section may include a return buffer for temporarily storing the substrates heated by the heating device and cooled by the cooling device after exposure, when the developing section is incapable of accepting the substrates. With this construction, when the developing section is incapable of accepting the substrates, the substrates heated by the heating device and cooled by the cooling device after exposure are temporarily stored in the return buffer. This prevents lowering of the quality of the substrates coated with a chemically amplified photoresist. Once the developing section becomes ready to accept the substrates, the substrates stored in the return buffer are loaded into the developing section in the main body of the treating apparatus to be developed.

It is further preferable that the interface section includes a feed buffer for temporarily storing the substrates to be exposed, when the exposing apparatus is incapable of accepting the substrates, a return buffer for temporarily storing the substrates heated by the heating device and cooled by the cooling device, when the developing section is incapable of accepting the substrates, and two substrate transport mechanisms; one of the substrate transport mechanisms is arranged at least to transfer the substrates to the heating device and the return buffer; and the other of the substrate transport mechanisms is arranged at least to transfer the substrates to the exposing apparatus and the feed buffer. With this construction, one of the substrate transport mechanisms transfers the substrates to the heating device and the return buffer, and the other substrate transport mechanism transfers the substrates to the exposing apparatus and the feed buffer. Thus, each transport mechanism can transport the substrates with an allowance of time. As a result, the substrates may be promptly transported to the heating device. This suppresses variations in the time before heating the substrates after exposure, thereby improving the accuracy of patterning of the photoresist.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 10 is a view showing flows of wafer transport by first to fourth main transport mechanisms.

DESCRIPTION OF THE PREFERRED EMBODIMENTS

A preferred embodiment of this invention will be described in detail hereinafter with reference to the drawings.

Figure 1:
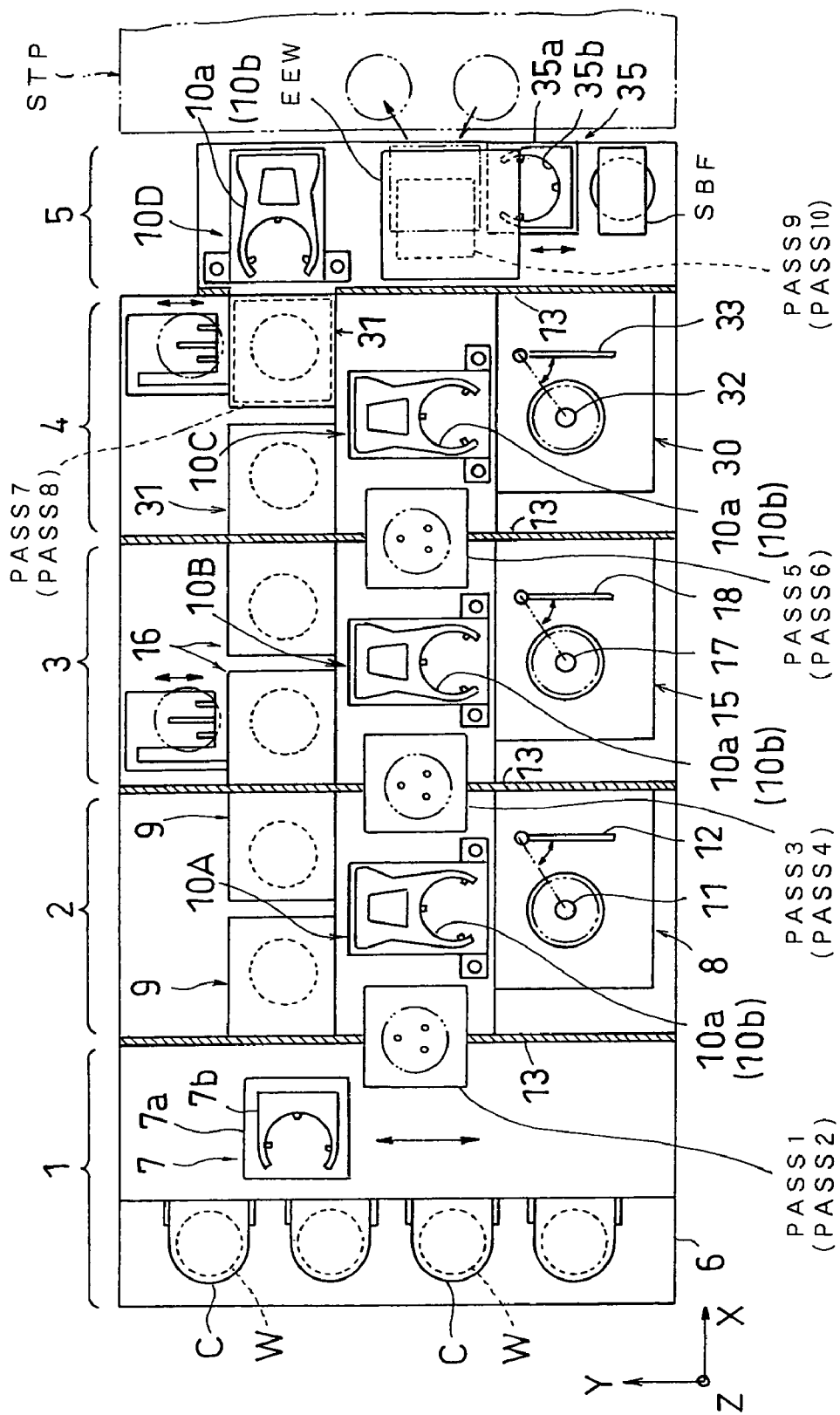
FIG. 1 is a plan view showing an outline of a substrate treating apparatus according to this invention.
Figure 2:
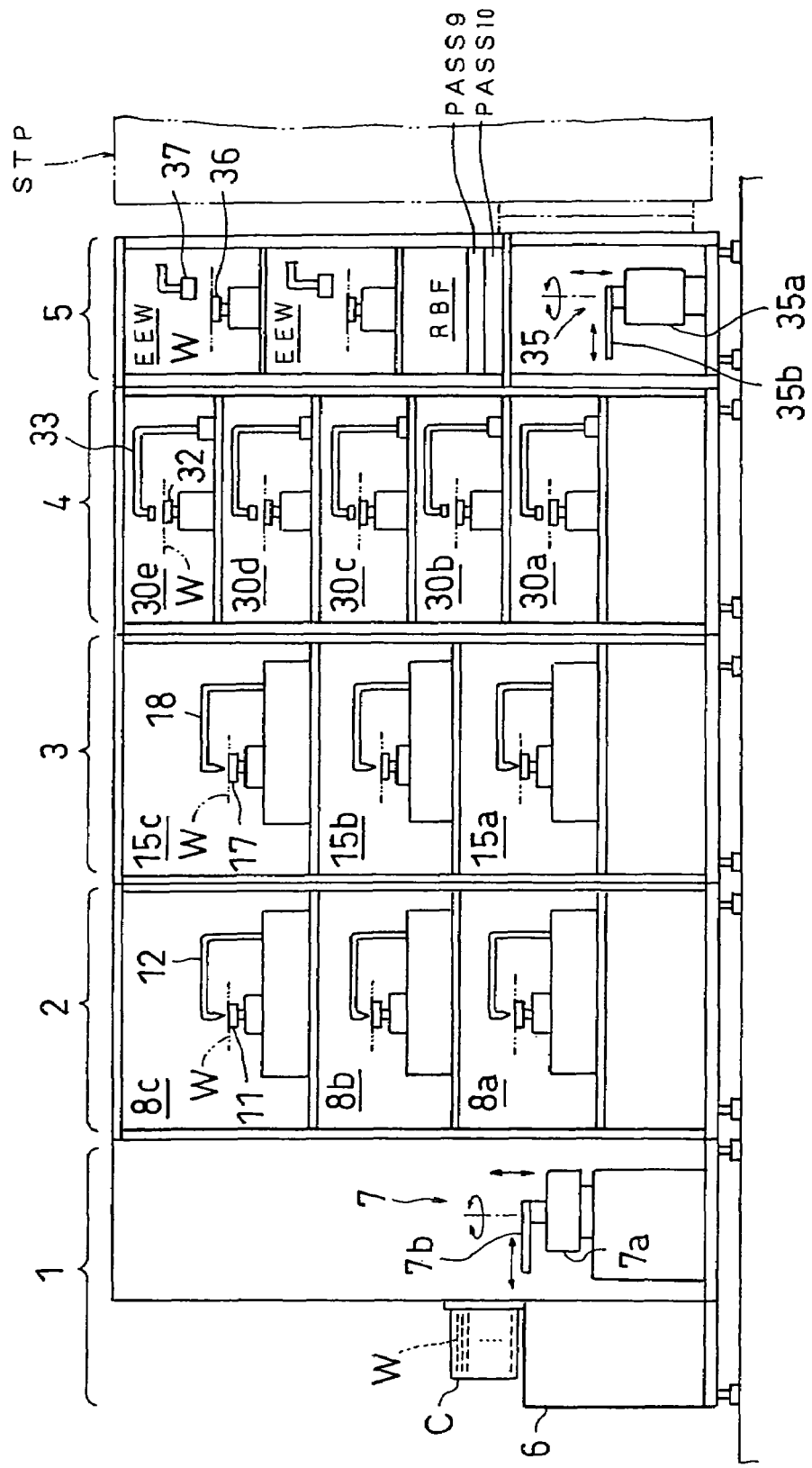
FIG. 2 is a front view showing an outline of the substrate treating apparatus according to this invention.
Figure 3:
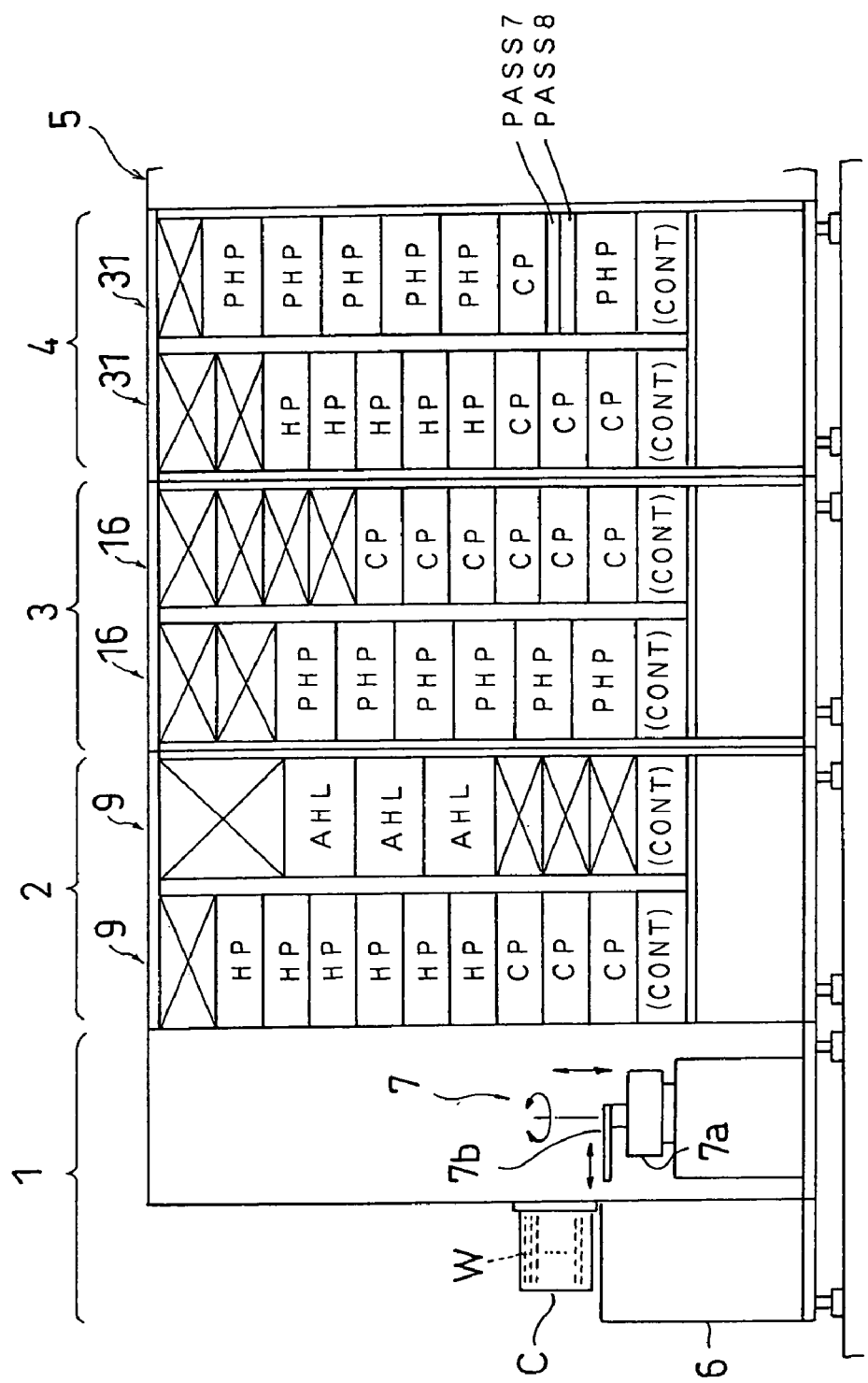
FIG. 3 is a front view of heat-treating modules.

FIG. 1 is a plan view showing an outline of a substrate treating apparatus according to this invention. FIG. 2 is a front view of the apparatus. FIG. 3 is a front view of heat-treating modules.

This substrate treating apparatus is constructed to form antireflection film and photoresist film on semiconductor wafers (hereinafter called simply "substrates or wafers"), and to develop exposed substrates. The substrates handled by the substrate treating apparatus according to this invention are, of course, not limited to semiconductor wafers, but include various substrates such as glass substrates for liquid crystal displays.

FIG. 1 refers. The substrate treating apparatus in this embodiment, broadly, includes an indexer block 1, three treating blocks for performing required chemical treatments on the substrates (specifically, an antireflection film forming block 2, a resist film forming block 3 and a developing block 4), and an interface block 5. These blocks are arranged side by side. The interface block 5 communicates with an exposing apparatus (e.g. stepper) STP which is an external apparatus separate from the substrate treating apparatus in this embodiment. The antireflection film forming block 2, resist film forming block 3 and developing block 4 constitute the main body of the treating apparatus in this invention. The developing block 4 and interface block 5 correspond to the developing section and interface section in this invention, respectively. The construction of each block will be described hereinafter.

The indexer block 1 will be described first. The indexer block 1 is a mechanism for fetching wafers W from cassettes C each for containing a plurality of wafers W in multiple stages, and depositing wafers W in the cassettes C. Specifically, the indexer block 1 includes a cassette table 6 for receiving a plurality of cassettes C in juxtaposition, and an indexer's transport mechanism 7 for successively fetching wafers W to be treated from each cassette C, and successively depositing treated wafers W in each cassette C. The transport mechanism 7 has a movable base 7a for horizontal movement (in Y-direction) along the cassette table 6. A holding arm 7b is mounted on the movable base 7a for holding a wafer W in horizontal posture. On the movable base 7a, the holding arm 7b is vertically movable (in Z-direction), swingable in a horizontal plane, and extendible and retractable radially of the swinging movement.

Figure 4:
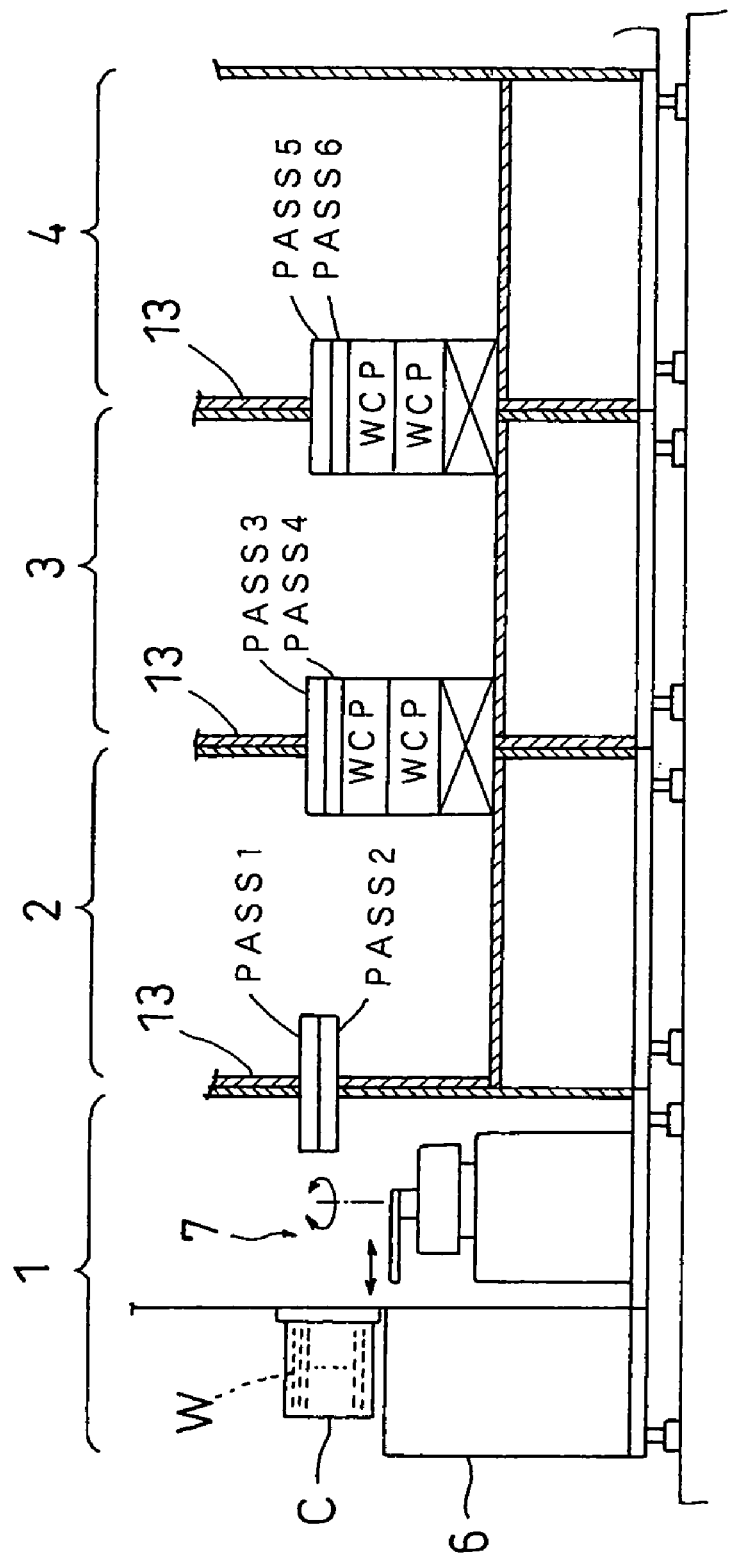
FIG. 4 is a sectional front view showing arrangements around substrate rests provided on partitions.

The antireflection film forming block 2 is disposed adjacent the indexer block 1. As shown in FIG. 4, an atmosphere shielding partition 13 is formed between the indexer block 1 and antireflection film forming block 2. The partition 13 has two substrate rests PASS1 and PASS2 arranged one over the other and close to each other for receiving wafers W to be transferred between the indexer block 1 and antireflection film forming block 2. The upper substrate rest PASS1 is used to feed wafers W from the indexer block 1 to the antireflection film forming block 2. The lower substrate rest PASS2 is used to return wafers W from the antireflection film forming block 2 to the indexer block 1. The substrate rests PASS1 and PASS2 partially extend through the partition 13. Each of the substrate rests PASS1 and PASS2 has a plurality of fixed support pins. This is the case also with other substrate rests PASS3-PASS10 to be described hereinafter. The substrate rests PASS1 and PASS2 include optical sensors, not shown, for detecting wafers W. A detection signal of each sensor is used for determining whether the substrate rest PASS1 or PASS2 is in a state for transferring a wafer W to or from the indexer's transport mechanism 7 or a first main transport mechanism 10A, to be described hereinafter, of the antireflection film forming block 2. Similar sensors are provided for the other substrate rests PASS3-PASS10 also.

The antireflection film forming block 2 will be described. The antireflection film forming block 2 is a mechanism for forming antireflection film under photoresist film in order to reduce standing wave and halation occurring in time of exposure. Specifically, this block 2 includes antireflection film coating modules 8 for coating the surfaces of wafers W with antireflection film, antireflection film heat-treating modules 9 for heat-treating the wafers W in relation to formation of the antireflection film, and the first main transport mechanism 10A for transferring the wafers W to and from the antireflection film coating modules 8 and antireflection film heat-treating modules 9.

In the antireflection film forming block 2, the coating modules 8 and heat-treating modules 9 are opposed to each other across the first main transport mechanism 10A. Specifically, the coating modules 8 are disposed in a front area of the apparatus, while the heat-treating modules 9 are disposed in a rear area of the apparatus. The other, resist film forming block 3 and developing block 4 also share the above feature of arranging the chemical treating modules and heat-treating modules in opposite areas across the main transport mechanism. In such an arrangement, the chemical treating modules and heat-treating modules are spaced away from each other, and hence a reduced chance of the chemical treating modules coming under the thermal influence of the heat-treating modules. In this embodiment, heat barriers, not shown, are formed in front of the heat-treating modules 9 to avoid the thermal influence on the antireflection film coating modules 8. Similar heat barriers are formed in the other, resist film forming block 3 and developing block 4 also.

As shown in FIG. 2, the antireflection film coating modules 8 consist of three antireflection film coating modules 8a-8c (hereafter referenced "8" where the individual coating modules are not distinguished) of the same construction arranged vertically. Each coating module 8 includes a spin chuck 11 for suction-supporting and spinning a wafer W in horizontal posture, and a nozzle 12 for supplying a coating solution to the wafer W held on the spin chuck 11 for forming antireflection film.

As shown in FIG. 3, the antireflection film heat-treating modules 9 include a plurality of heating plates HP for heating wafers W to a predetermined temperature, a plurality of cooling plates CP for cooling the heated wafers W to room temperature, and a plurality of adhesion modules AHL for heat-treating the wafers W in an atmosphere of HMDS (hexamethyldisilazane) vapor in order to promote adhesion of the resist film to the wafers W. These heat-treating modules 9 further include heater controllers (CONT) arranged in lower positions, and piping, wiring and reserve spaces allocated to upper positions (indicated by "X" mark in FIG. 3).

In the antireflection film heat-treating modules 9, these heat-treating modules HP, CP and AHL are stacked vertically, and the group of heat-treating modules is divided into a plurality of (two in this embodiment) columns standing side by side. The other, resist film forming block 3 and developing block 4 also share the above feature of the chemical treating modules arranged vertically and the group of vertically stacked heat-treating modules being divided into a plurality of columns.

The vertical arrangements of the chemical treating modules and the heat-treating modules in each of the treating blocks 2-4 have the effect of reducing the space occupied by the substrate treating apparatus. The group of vertically stacked heat-treating modules being divided into a plurality of columns provides the advantages of facilitating maintenance of the heat-treating modules, and eliminating the need to extend to a great height, ducting, piping and power supply lines required for the heat-treating modules.

The first main transport mechanism 10A will be described. The first main transport mechanism 10A has the same construction as the second, third and fourth main transport mechanisms 10B, 10C and 10D in the other, resist film forming block 3, developing block 4 and interface block 4. The first to fourth main transport mechanisms 10A-10D will be referred to hereinafter as the main transport mechanism(s) 10 where these transport mechanisms are not distinguished.

Figure 6A:
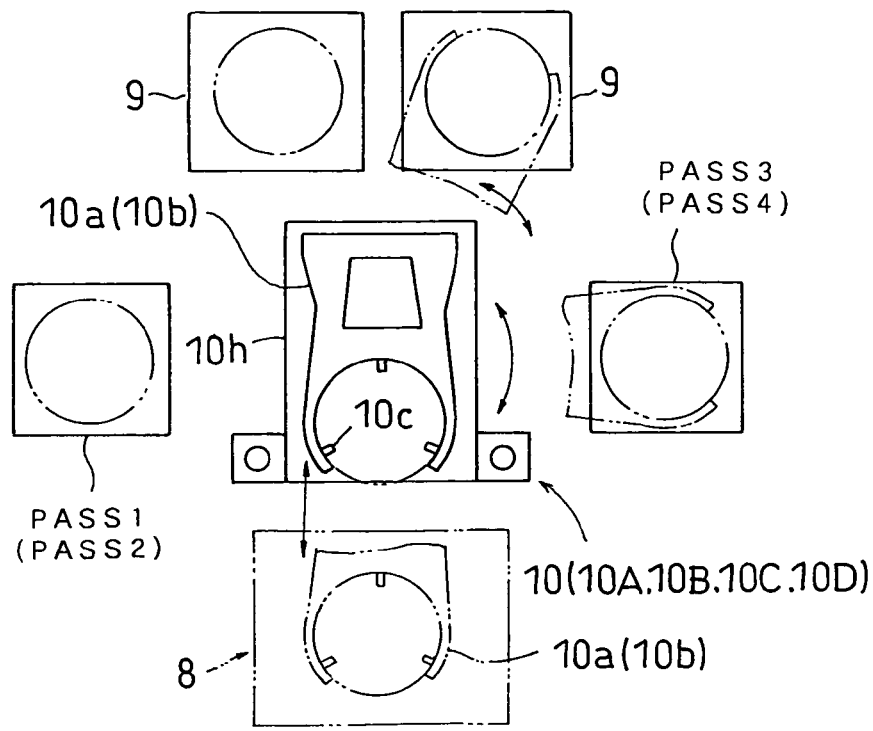
FIG. 6A is a plan view showing an outline of a main transport mechanism.
Figure 6B:
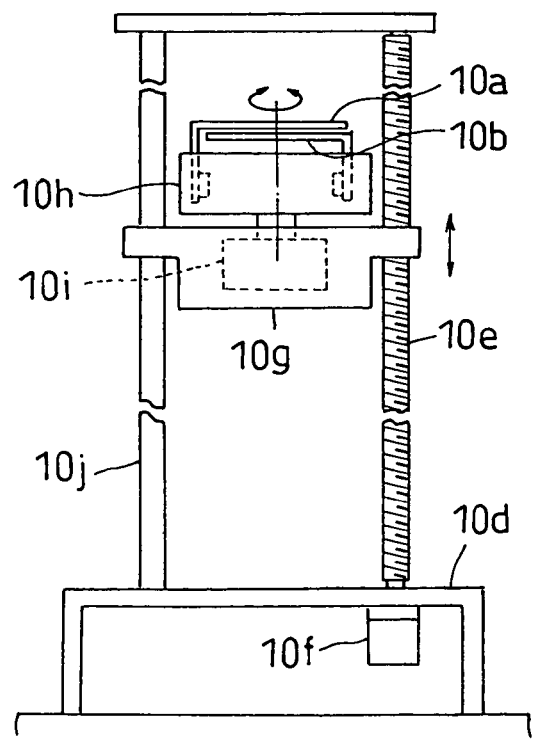
FIG. 6B is a front view showing an outline of the main transport mechanism.

Reference is made to FIGS. 6A and 6B. FIG. 6A is a plan view of the main transport mechanism 10. FIG. 6B is a front view thereof. The main transport mechanism 10 includes two holding arms 10a and 10b arranged vertically and close to each other for holding wafers W in horizontal posture. Each holding arm 10a or 10b has a C-shaped forward end, and a plurality of pins 10c projecting inwardly from inside the C-shaped end for supporting peripheries of wafer W from below. The main transport mechanism 10 has a base 10d fixed to a base of the apparatus. The base 10d rotatably supports a screw shaft 10e extending upward. A motor 10f is attached to the base 10d for rotating the screw shaft 10e. A lift deck 10g is meshed with the screw shaft 10e. When the motor 10f rotates the screw shaft 10e, the lift deck 10g moves vertically as guided by a guide rod 10*j*. An arm base 10*h* is mounted on the lift deck 10*g* to be rotatable about a vertical axis. A motor 10*i* is mounted in the lift deck 10*g* for rotating the arm base 10*h*. The two holding arms 10*a* and 10*b* noted above are arranged vertically on the arm base 10*h*. The holding arms 10*a* are 10*b* are extendible and retractable radially of rotation of the arm base 10*h* and independently of each other by drive mechanisms (not shown) mounted in the arm deck 10*h*.

The resist film forming block 3 is disposed adjacent the antireflection film forming block 2 described above. As shown in FIG. 4, an atmosphere shielding partition 13 is formed also between the antireflection film forming block 2 and resist film forming block 3. This partition 13 has two substrate rests PASS3 and PASS4 arranged one over the other and close to each other for receiving wafers W to be transferred between the antireflection film forming block 2 and resist film forming block 3. As are the substrate rests PASS1 and PASS2, the upper substrate rest PASS3 is used to feed wafers W and the lower substrate rest PASS4 to return wafers W. The substrate rests PASS3 and PASS4 partially extend through the partition 13. Two water-cooled cooling plates WCP extend through the partition 13 under the substrate rests PASS3 and PASS4 for cooling the wafers W in a general or broad way.

The resist film forming block 3 will be described. The resist film forming block 3 is a mechanism for forming photoresist film over the antireflection film formed on the wafers W. This embodiment uses a chemically amplified resist as photoresist. The resist film forming block 3 includes resist film coating modules 15 for applying and forming photoresist film on the wafers W coated with the antireflection film, resist film heat-treating modules 16 for heat-treating the wafers W in relation to formation of the photoresist film, and the second main transport mechanism 10B for transferring the wafers W to and from the resist film coating modules 15 and resist film heat-treating modules 16.

As shown in FIG. 2, the resist film coating modules 15 consist of three resist film coating modules 15*a*-15*c* (hereafter referenced "15" where the individual coating modules are not distinguished) of the same construction arranged vertically. Each coating module 15 includes a spin chuck 17 for suction-supporting and spinning a wafer W in horizontal posture, and a nozzle 18 for supplying a coating solution to the wafer W held on the spin chuck 17 for forming resist film.

As shown in FIG. 3, the resist film heat-treating modules 16 include a plurality of heating modules PHP, with temporary substrate deposits, for heating wafers W to a predetermined temperature, and a plurality of cooling plates CP for cooling the heated wafers W to room temperature with high precision. As in the antireflection film forming block 2, these heat-treating modules are arranged vertically and in a plurality of columns.

The heating modules PHP with temporary substrate deposits will be described.

Figure 7A:
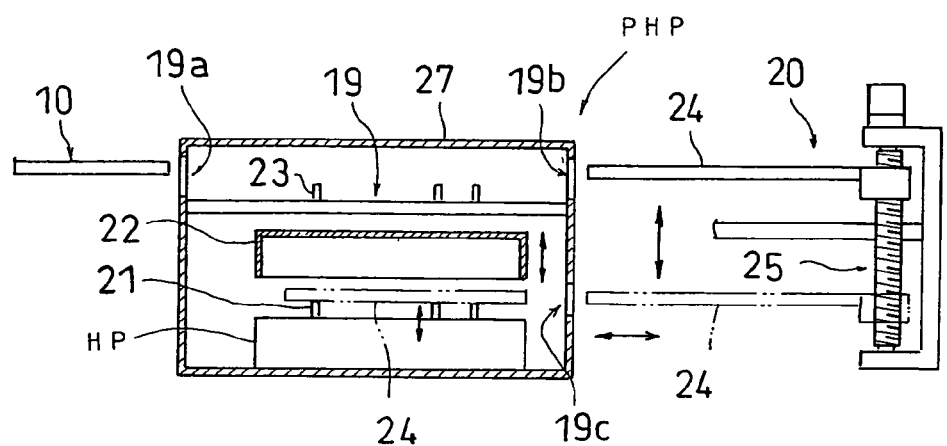
FIG. 7A is a sectional side view of a heating module with a temporary wafer deposit.
Figure 7B:
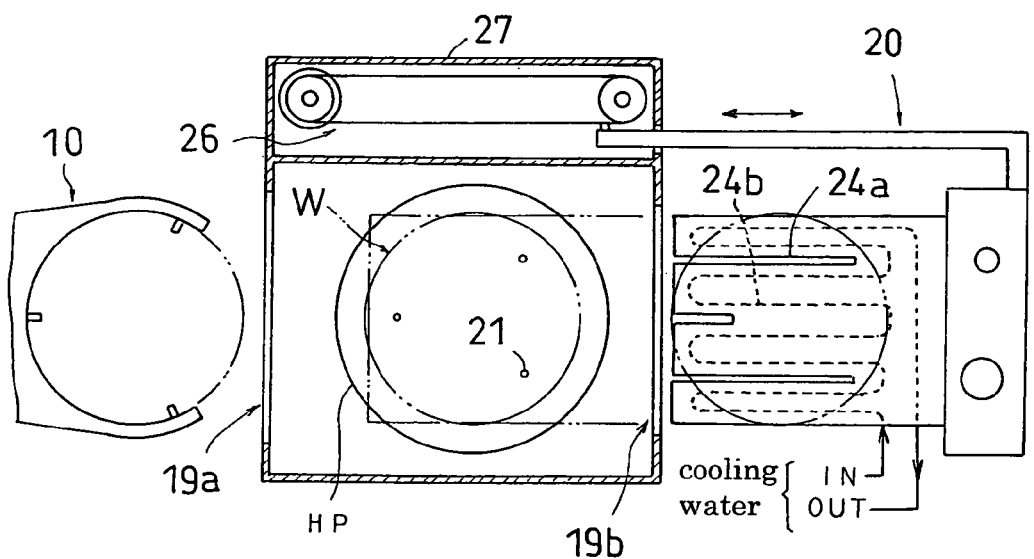
FIG. 7B is a sectional plan view of the heating module with the temporary wafer deposit.

Reference is made to FIGS. 7A and 7B. FIG. 7A is a sectional side view of one of the heating modules PHP with temporary wafer deposits. FIG. 7B is a sectional plan view thereof. The heating module PHP includes a heating plate HP for heating a wafer W placed thereon, a temporary substrate deposit 19 for keeping the wafer W in an upper position or lower position (upper position in this embodiment) away from the heating plate HP, and a local transport mechanism 20 for transporting the wafer W between the heating plate HP and temporary substrate deposit 19. The heating plate HP has a plurality of support pins 21 projectable above and retractable below the upper surface of the plate. An upper lid 22 is disposed above the heating plate HP to be vertically movable for covering the wafer W in time of heating treatment. The temporary substrate deposit 19 has a plurality of fixed support pins 23 for supporting the wafer W.

The local transport mechanism 20 includes a holding plate 24 for holding a wafer W in horizontal posture. The holding plate 24 is vertically movable by a screw feed mechanism 25, and extendible and retractable by a belt drive mechanism 26. The holding plate 24 defines a plurality of slits 24*a* to avoid interference with the movable support pins 21 or fixed support pins 23 when the holding plate 24 is extended over the heating plate HP or temporary substrate deposit 19. The local transport mechanism 20 includes a device for cooling a wafer W while transporting the wafer W from the heating plate HP to the temporary substrate deposit 19. This cooling device, for example, has a cooling water channel 24*b* formed inside the holding plate 24 for circulating cooling water.

The local transport mechanism 20 is opposed to the second main transport mechanism 10B across the heating plate HP and temporary substrate deposit 19. That is, the local transport mechanism 20 is disposed adjacent the rear surface of the apparatus. The heating plate HP and temporary substrate deposit 19 are enclosed in a housing 27. The housing 27 has an opening 19*a* formed in the front wall of an upper portion thereof covering the temporary substrate deposit 19 for allowing entry of the second main transport mechanism 10B and an opening 19*b* formed in the rear wall of the upper portion for allowing entry of the local transport mechanism 20. Further, the housing 27 has a closed front surface in a lower portion thereof covering the heating plate HP, and an opening 19*c* formed in the rear wall of the lower portion for allowing entry of the local transport mechanism 20.

A wafer W is loaded into and unloaded from the above heating module PHP as follows. First, the main transport mechanism 10 (the second main transport mechanism 10B in the case of the resist film forming block 3) places a wafer W on the fixed support pins 23 of temporary substrate deposit 19. Then, the holding plate 24 of the local transport mechanism 20 advances under the wafer W and slightly ascends to pick up the wafer W from the fixed support pins 23. The holding plate 24 holding the wafer W leaves the housing 27, and descends to a position opposed to the heating plate HP. At this time, the movable support pins 21 of the heating plate HP are in the lowered position, and the upper lid 22 is raised. The holding plate 24 holding the wafer W advances over the heating plate HP. The movable support pins 21 are raised to pick up the wafer W, and thereafter the holding plate 24 leaves the housing 27. Then, the movable support pins 21 are lowered to lay the wafer W on the heating plate HP. The upper lid 22 is lowered to cover the wafer W. The wafer W is heated in this state. After the heating treatment, the upper lid 22 is raised. The movable support pins 21 are raised to pick up the wafer W. The holding plate 24 advances under the wafer W, and then the movable support pins 23 are lowered to lay the wafer W on the holding plate 24. The holding plate 24 holding the wafer W leaves the housing 27, moves up and transports the wafer W into the temporary substrate deposit 19. The wafer W supported by the holding plate 24 in this transporting process is cooled by the cooling function of the holding plate 24. The holding plate 24 transfers the cooled (i.e. returned to room temperature) wafer W to the temporary substrate deposit 19. The main transport mechanism 10 takes out and transports the wafer W.

As described above, the main transport mechanism 10 transfers wafers W to and from the temporary substrate deposit 19 only, and not to and from the heating plate HP. Thus, the main transport mechanism 10 is free from temperature increase. Further, the opening 19*c* for loading and unloading wafers W on/from the heating plate HP is located in the side remote from the main transport mechanism 10. Thus, the main transport mechanism 10 is not heated by the hot atmosphere escaping through the opening 19*c*. The resist film coating modules 15 are never subject to the adverse influence of the hot atmosphere escaping through the opening 19*c*, either.

The developing block 4 is disposed adjacent the resist film forming block 3 described above. As shown in FIG. 4, an atmosphere shielding partition 13 is formed also between the resist film forming block 3 and developing block 4. This partition 13 has, arranged vertically, two substrate rests PASS5 and PASS6 for transferring wafers W between the two blocks 3 and 4, and two water-cooled cooling plates WCP for cooling the wafers W in a general or broad way.

The developing block 4 will be described. The developing block 4 is a mechanism for developing exposed wafers W. Specifically, the developing block 4 includes developing modules 30 for developing exposed wafers W, heat-treating modules 31 for heat-treating the wafers W in relation to development, and the third main transport mechanism 10C for transferring the wafers W to and from the developing modules 30 and heat-treating modules 31.

As shown in FIG. 2, the developing modules 30 consist of five developing modules 30*a*-30*e* (hereafter referenced "30" where the individual developing modules are not distinguished) of the same construction arranged vertically. Each developing module 30 includes a spin chuck 32 for suction-supporting and spinning a wafer W in horizontal posture, and a nozzle 33 for supplying a developer to the wafer W held on the spin chuck 32.

As shown in FIG. 3, the heat-treating modules 31 include a plurality of heating plates HP, a plurality of heating modules PHP with temporary substrate deposits, and a plurality of cooling plates CP. As in the other blocks 2 and 3, these heat-treating modules are arranged vertically and in a plurality of columns. The right-hand column (adjacent the interface block 5) of heat-treating modules 31 includes substrate rests PASS7 and PASS8 arranged one over the other and close to each other for transferring wafers W to and from the interface block 5. The upper substrate rest PASS7 is used to feed wafers W and the lower substrate rest PASS8 to return wafers W. In the heating modules PHP with the temporary substrate deposits arranged in the developing block 4, the heating plates HP correspond to the heating device in this invention. The cooling device provided for the local transport mechanism 20 corresponds to the cooling device in this invention.

The interface block 5 will be described. The interface block 5 is a mechanism for transferring wafers W to and from the exposing apparatus STP which is an external apparatus separate from the substrate treating apparatus. The interface block 5 in this embodiment includes, besides an interface's transport mechanism 35 for transferring wafers W to and from the exposing apparatus STP, two edge exposing modules EEW for exposing peripheries of wafers W coated with photoresist, and the fourth main transport mechanism 10D for transferring wafers W to and from the edge exposing modules EEW and the heating modules PHP with temporary substrate deposits arranged in the developing block 4. The fourth main transport mechanism 10D corresponds to the "substrate transport mechanism for transferring the substrates to the heating device" in this invention.

As shown in FIG. 2, each edge exposing module EEW includes a spin chuck 36 for suction-supporting and spinning a wafer W in horizontal posture, and a light emitter 37 for exposing peripheries the wafer W held on the spin chuck 36. The two edge exposing modules EEW are arranged one over the other in a middle position of the interface block 5. The fourth main transport mechanism 10D disposed adjacent the edge exposing modules EEW and the heat-treating modules of the developing block 4 has the same construction as the main transport mechanism 10 illustrated in FIGS. 6A and 6B.

Figure 5:
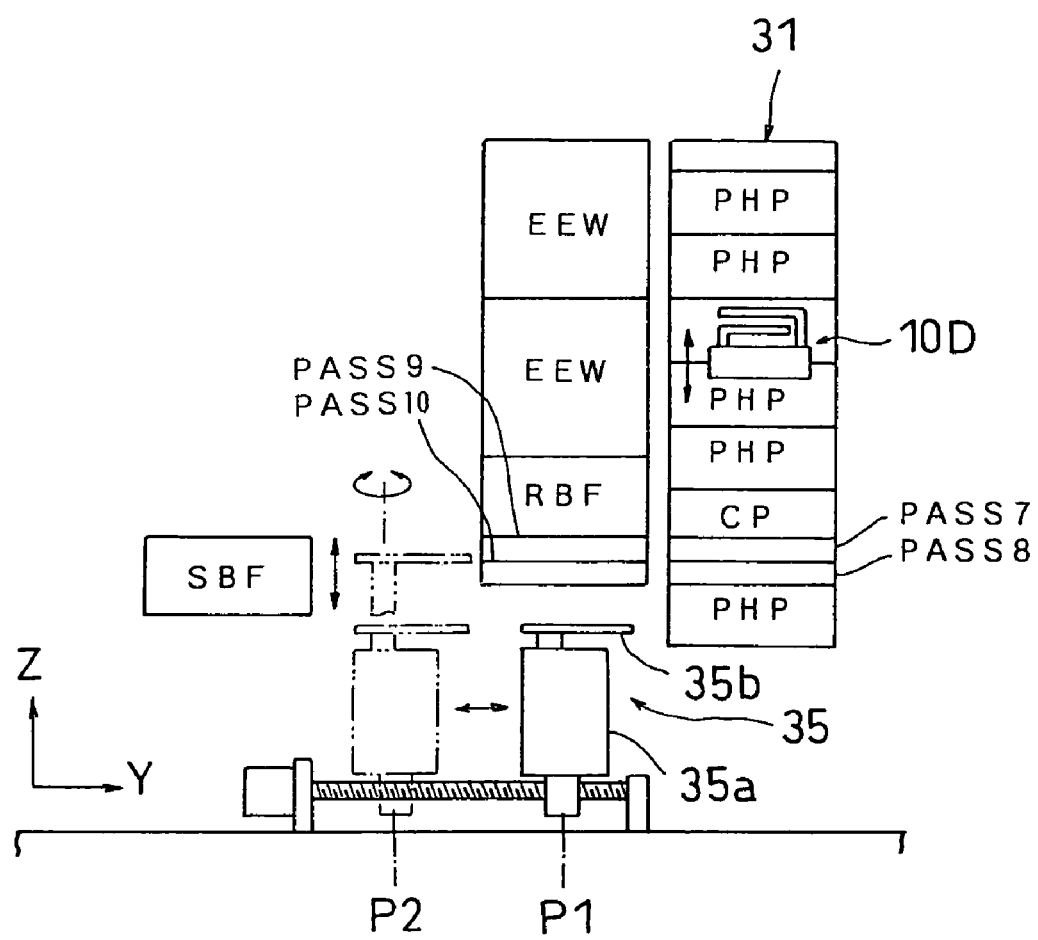
FIG. 5 is a side view showing an outline of an interface block.

Reference is made to FIGS. 2 and 5. FIG. 5 is a side view of the interface block 5. A substrate return buffer RBF is disposed below the two edge exposing modules EEW, and two substrate rests PASS9 and PASS10 are arranged one over the other, below the buffer RBF. The substrate return buffer RBF is provided for temporarily storing wafers W having undergone post-exposure heating treatment in the heating modules PHP of the developing block 4 when the developing block 4 cannot develop the wafers W due to some fault, for example. This buffer RBF is in the form of a storage rack for storing a plurality of wafers W in multiple stages. The substrate rests PASS9 and PASS10 are used for transferring wafers W between the fourth main transport mechanism 10D and interface's transport mechanism 35. The upper rest is for feeding wafers W, while the lower rest is for returning wafers W.

As shown in FIGS. 1 and 5, the interface's transport mechanism 35 has a movable base 35*a* for horizontal movement in Y-direction, and a holding arm 35*b* mounted on the movable base 35*a* for holding a wafer W. The holding arm 35*b* is vertically movable, swingable, and extendible and retractable radially of the swinging movement. The interface's transport mechanism 35 has one end (position P1 shown in FIG. 5) of its transport path extending under the substrate rests PASS9 and PASS10 arranged vertically. In the position P1, the interface's transport mechanism 35 transfers wafers W to and from the exposing apparatus STP. In the other end position P2 of the transport path, the interface's transport mechanism 35 transfers wafers W to and from the substrate rests PASS9 and PASS10, and deposits and fetch wafers W to/from a feed buffer SBF. The feed buffer SBF is provided for temporarily storing wafers W to be exposed, when the exposing apparatus STP cannot accept the wafers W, and is in the form of a storage rack for storing a plurality of wafers W in multiple stages.

The substrate treating apparatus having the above construction feeds downflows of clean air into the indexer block 1, respective treating blocks 2, 3 and 4 and interface block 5 to avoid adverse influences on the processes exerted by floating particles and air currents in these blocks. The interior of each block is maintained at a slightly higher pressure than external environment of the apparatus to prevent entry of particles, contaminants and the like from the external environment. The antireflection film forming block 2, in particular, is set to a higher atmospheric pressure than the indexer block 1. Since the atmosphere in the indexer block 1 does not flow into the antireflection film forming block 2, the treating processes may be carried out in the respective blocks 2, 3 and 4 without being influenced by external atmosphere.

A control system, particularly controls of substrate transport, of the substrate treating apparatus in this embodiment will be described next.

Figure 8A:
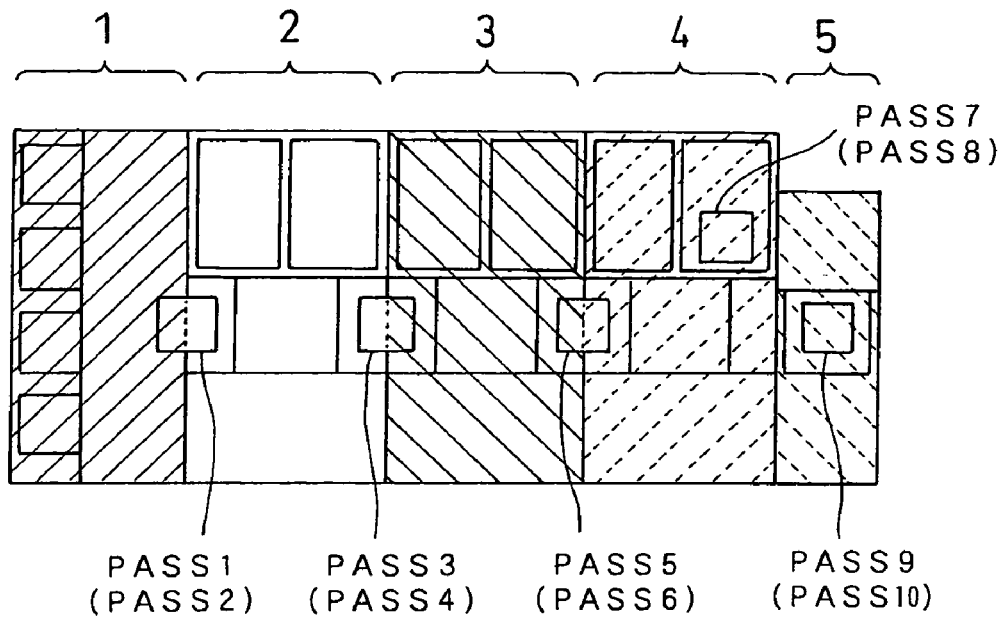
FIG. 8A is a plan view showing an arrangement of blocks in the apparatus according to the invention.

The indexer block 1, antireflection film forming block 2, resist film forming block 3, developing block 4 and interface block 5 described above are components resulting from a mechanical division of the substrate treating apparatus. Specifically, the substrate treating apparatus is formed by assembling the respective blocks to individual block frames and connecting the block frames together (see FIG. 8A).

On the other hand, as one of the features of this invention, controlled units relating to substrate transport are provided separately from the blocks constituting the mechanical components. That is, each single controlled unit includes treating modules for performing required treatment of substrates, and a single main transport mechanism for transferring the substrates to and from the treating modules. Such controlled units are juxtaposed to form the substrate treating apparatus. The main transport mechanisms of the respective controlled units transfer substrates through the substrate rests, and each controlled unit includes a control device for controlling at least the substrate transfer operation of the main transport mechanism of each controlled unit. The control device of each controlled unit performs, independently of the other control devices, a series of controls relating to substrate transport including transfer of substrates to and from the treating modules and transfer of substrates to and from the substrate rests.

Figure 8B:
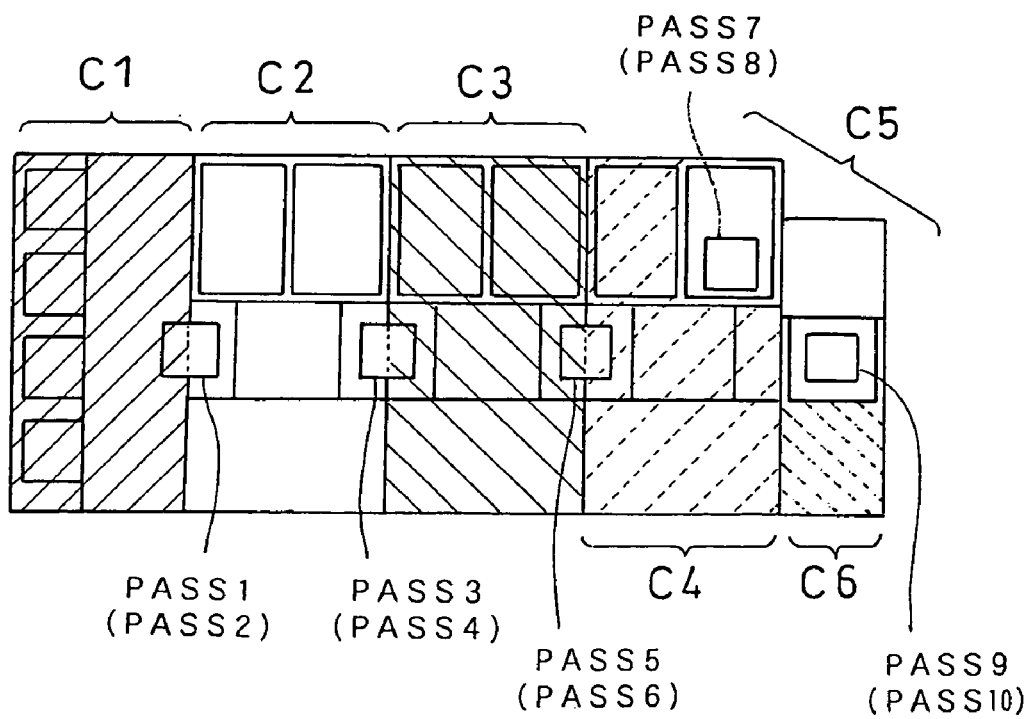
FIG. 8B is a plan view showing an arrangement of cells in the apparatus according to the invention.

The controlled units in this embodiment are hereinafter called "cells". FIG. 8B shows an arrangement of cells in this embodiment.

An indexer cell C1 includes the cassette table 6 and indexer's transport mechanism 7. Consequently, this cell C1 has the same construction as the indexer block 1 which is a component divided mechanically. An antireflection film forming cell C2 includes the antireflection film coating modules 8, antireflection film heat-treating modules 9 and first main transport mechanism 10A. Consequently, this cell C2 also has the same construction as the antireflection film forming block 2 which is a component divided mechanically. A resist film forming cell C3 includes the resist film coating modules 15, resist film heat-treating modules 16 and second main transport mechanism 10B. Consequently, this cell C3 also has the same construction as the resist film forming block 3 which is a component divided mechanically.

On the other hand, a developing cell C4 includes the developing modules 30, heat-treating modules 31 excluding the heat-treating modules (heating modules PHP in the embodiment) used for post-exposure heating, and the third main transport mechanism 10C. This cell C4 has a construction different from the developing block 4 which is a component divided mechanically, in excluding the heating modules PHP used for post-exposure heating.

A post-exposure heating cell C5 includes post-exposure heating modules (i.e. heating modules PHP arranged in the developing block 4 in the embodiment) for heating exposed wafers W before development, edge exposing modules EEW and fourth main transport mechanism 10D. This cell C5 bridges the developing block 4 and interface block 5 which are components divided mechanically, and is a characteristic cell of this embodiment. Since the post-exposure heating modules (i.e. heating modules PHP) and fourth main transport mechanism 10D are incorporated into the single cell as noted above, exposed wafers W may be loaded into the heating modules PHP promptly for heat treatment. This is advantageous where a chemically amplified photoresist is used which requires to be heated quickly after exposure.

An interface cell C6 includes the interface's transport mechanism 35 for transferring wafers W to and from the exposing apparatus STP which is an external apparatus. This cell C6 does not include the fourth main transport mechanism 10D or edge exposing modules EEW and, in this respect, is different from the interface block 5 which is a component divided mechanically.

This embodiment has the above six cells C1-C6 arranged in juxtaposition. Wafers W are transferred between the cells C1-C6 through the substrate rests PASS1-PASS10. In other words, each controlled unit (cell) in this invention includes a single main transport mechanism, and treating modules to and from which the main transport mechanism transfers wafers W received from a particular one of the substrate rests before placing the wafers W on the other substrate rest.

Figure 9A:
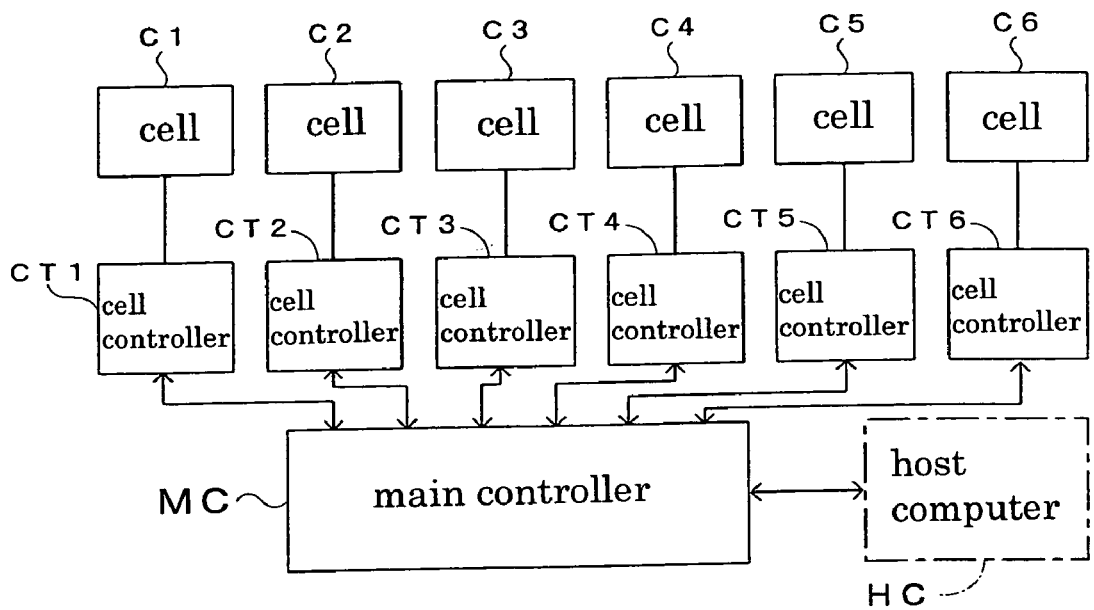
FIG. 9A is a block diagram of a control system in the apparatus according to the invention.

The cells C1-C6 individually include controllers CT1-CT6 for controlling at least substrate transfer operations of the main transport mechanisms (including the indexer's transport mechanism 7 and interface's transport mechanism 35), respectively. Each of the controllers CT1-CT6 independently performs a series of controls, starting with receipt of a wafer W from a predetermined substrate rest, and finishing with placement of the wafer W on a predetermined substrate rest. Specifically, as shown in FIG. 9A, the controllers CT1-CT6 of the respective cells C1-C6 exchange information in such a way that one controller sends information to the controller of a next cell that a wafer W has been placed on a predetermined substrate rest, and the controller of the next cell having received the wafer W returns information to the controller of the preceding cell that the wafer W has been received from the predetermined substrate rest.

Figure 9B:
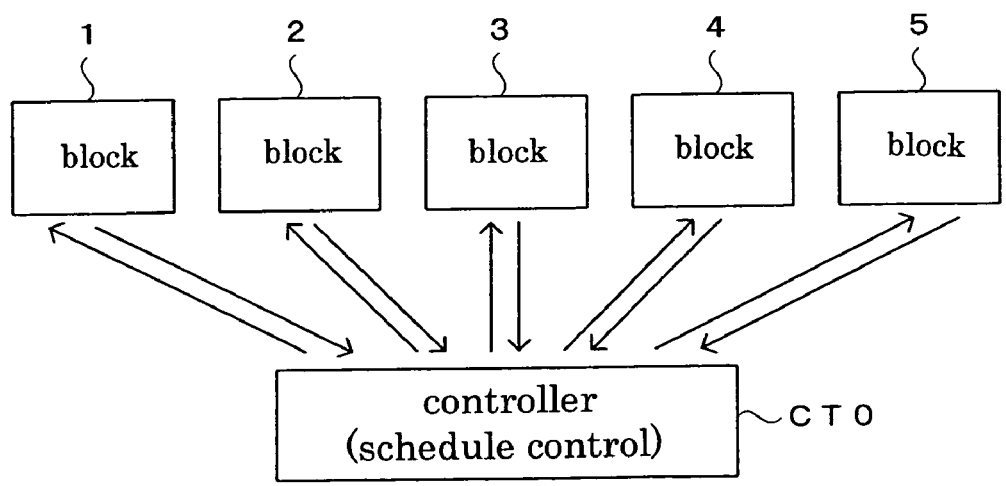
FIG. 9B is a block diagram of a control system in a conventional apparatus shown for comparison purposes.

That is, each of the controllers CT1-CT6 performs controls only for transfer of wafers W within its cell without regard to movement of the main transport mechanisms in the adjoining cells. Thus, the controllers CT1-CT6 operate under a reduced control load. In the control method in a conventional substrate treating apparatus, as shown in FIG. 9B, each of the blocks 1-5 transmits information relating to substrate transport to a controller CT0 for schedule management, and the controller CT0 performs an overall control of substrate transport. Thus, the controller CT0 has an increased load.

In this embodiment, the controllers CT1-CT6 operate under a reduced control load as described above, and thus the substrate treating apparatus has correspondingly improved throughput. In the conventional control method shown in FIG. 9B, a treating module newly added necessitates an extensive revision of the schedule management program in the controller CT0. In the control method according to this invention, a cell may be added easily since it will not influence the adjoining cells. A cell that can be added is not limited to a particularly type. For example, an inspecting cell may be added between the resist film forming cell C3 and developing cell C4 for inspecting the thickness of resist film formed on wafers W or for inspecting the line width of developed resist film. In this case, the inspecting cell, as do the other cells in this embodiment, includes substrate inspecting modules for inspecting substrates, and a main transport mechanism for transporting substrates to and from the inspecting modules. The substrates are transferred between the inspecting cell and adjacent cells through substrate rests.

Where the main transport mechanism transports a wafer W from a particular location to another location, as one step, in each of the antireflection film forming cell C2, resist film forming cell C3 and the developing cell C4, which are different controlled units for different chemical treatments, the first, second and third main transport mechanisms 10A, 10B and 10C in the cells C2, C3 and C4 perform substantially the same number of transport steps. This is another feature of the substrate treating apparatus in this embodiment. While its details will be apparent from the operation of the apparatus in this embodiment described hereinafter, as shown in FIG. 10, each of the above main transport mechanisms 10A, 10B and 10C performs approximately six transport steps.

In this embodiment, the main transport mechanism 10 carries out one transport step in about four seconds. Thus, with the main transport mechanism 10 performing six transport steps, each of the cells C2-C3 discharges one wafer W every 24 seconds (i.e. in a processing cycle of 24 seconds) to the adjoining cell. That is, this apparatus can process 150 wafers W per hour. If one main transport mechanism performs more transport steps than the other main transport mechanisms, the throughput of the substrate treating apparatus is dependent on the processing cycle of the cell to which that one main transport mechanism belongs. Where, for example, each of the main transport mechanisms 10A and 10C of the cells C2 and C4 performs five transport steps, and the main transport mechanism 10B of the cell C3 performs eight transport steps, wafers W flow between the cells C2-C4 only in the processing cycle of the cell C3 (which is 32 seconds in this case). Even if the main transport mechanisms 10A and 10C of cells C2 and C4 can afford to transport more wafers W, the substrate treating apparatus can process only 112.5 wafers W per hour.

In this embodiment, on the other hand, each of the main transport mechanisms 10A, 10B and 10C of the antireflection film forming cell C2, resist film forming cell C3 and developing cell C4 shares approximately the same number of transport steps. This embodiment avoids a situation where one main transport mechanism reaches the limit of transporting process earlier than the other main transport mechanisms. As a result, the substrate treating apparatus provides improved throughput.

Regarding the post-exposure heating cell C5 disposed adjacent the developing cell C4, the fourth main transport mechanism 10D of this cell C5 is set to perform five transport steps. The post-exposure heating cell C5 requires a strict management of time from exposure to heating of wafer W. Thus, from the viewpoint of allowing elbowroom, the fourth main transport mechanism 10D is given a lighter transport load than the other main transport mechanisms. Where no such elbowroom is required for the fourth main transport mechanism 10D, this heating cell C5 will have a margin for one transport step. This transport margin may be utilized for adding a new treating module, e.g. a module for inspecting wafers W, to the post-exposure heating cell C5. Even with such a substrate inspecting module added, the main transport mechanism 10D of the cell C5 shares only six transport steps as do the main transport mechanisms of the other cells. That is, even where a substrate inspecting module is added to the cell C5 having a transport margin, the cell C5 has the same processing cycle of 24 seconds as the other cells. This results in no reduction in the throughput of the substrate treating apparatus.

Operation of the substrate treating apparatus in this embodiment will be described next. See FIG. 10 particularly for the transport steps executed by the main transport mechanisms 10A-10D of the antireflection film forming cell C2, resist film forming cell C3, developing cell C4 and post-exposure heating cell C5.

First, the indexer's transport mechanism 7 of the indexer cell C1 (indexer block 1) moves horizontally to a position opposed to a predetermined cassette C. Then, a wafer W to be treated is fetched from the cassette C by vertically moving and extending and retracting the holding arm 7b. With the wafer W held by the holding arm 7b, the indexer's transport mechanism 7 moves horizontally to the position opposed to the substrate rests PASS1 and PASS2. Then, the transport mechanism 7 places the wafer W held by the holding arm 7b on the upper, substrate feeding rest PASS1. When a treated wafer W is found on the lower, substrate returning rest PASS2, the indexer's transport mechanism 7 loads the treated wafer W on the holding arm 7b, and deposits this treated wafer W in a predetermined cassette C. Subsequently, the transport mechanism 7 repeats the operation to fetch a wafer W to be treated from the cassette C, transport the wafer W to the substrate rest PASS1, receive a treated wafer W from the substrate rest PASS2, and deposit the treated wafer W in the cassette C.

Operation of the antireflection film forming cell C2 (antireflection film forming block 2) will be described. After the wafer W to be treated is placed on the substrate rest PASS1, as shown in FIG. 10, the first main transport mechanism 10A of the cell C2 vertically moves and swings the holding arms 10a and 10b together to the position opposed to the substrate rests PASS1 and PASS2. The first main transport mechanism 10A performs a wafer transfer operation to place a treated wafer W held by one holding arm 10b on the lower, substrate returning rest PASS2, and thereafter load the wafer W to be treated from the upper, substrate feeding rest PASS1 on the other holding arm 10a. Specifically, the holding arm 10b is advanced to place a treated wafer W on the substrate rest PASS2. The holding arm 10b having delivered the treated wafer W is retracted to the original position. Then, the holding arms 10a and 10b are slightly raised together, and thereafter the holding arm 10a is advanced to pick up the wafer W to be treated from the substrate rest PASS1. The holding arm 10a having received the wafer W is retracted to the original position.

The above transfer of the wafer W to be treated and the treated wafer W to and from the substrate rests PASS1 and PASS2 is indicated by a transport step (1+α) of the first main transport mechanism 10A in FIG. 10. Here, "α" represents the part of the transport step for slightly raising the holding arms 10a and 10b from the position opposed to the substrate rest PASS2 to the position opposed to the substrate rest PASS1 in order to receive the wafer W to be treated from the substrate rest PASS1. As noted hereinbefore, the substrate rests PASS1 and PASS2 are arranged vertically and close to each other. The time consumed in the movement between substrate rests PASS1 and PASS2 is brief and negligible. Thus, the transport step (1+α) may be regarded as one transport step (i.e. a substrate transfer operation carried out by the main transport mechanism within a predetermined time (e.g. four seconds) in this embodiment).

Upon completion of the transfer of wafers W to and from the substrate rests PASS1 and PASS2, the first main transport mechanism 10A vertically moves and swings together the holding arm 10a holding the wafer W to be treated and the unloaded holding arm 10b holding no wafer W to a position opposed to a predetermined cooling plate CP of the antireflection film heat-treating modules 9. Usually, a prior-treated wafer W is present on this cooling plate CP. Thus, the unloaded holding arm 10b is first advanced to pick up the cooled wafer W from the cooling plate CP. Then, the holding arm 10a holding the wafer W to be treated is advanced to place the wafer W to be treated on the cooling plate CP. The wafer W placed on the cooling plate CP is cooled to room temperature with high precision while the main transport mechanism 10A performs other transport operations. The transfer of wafers W to and from the cooling plate CP is carried out without vertically moving the two holding arms 10a and 10b. Thus, the transfer of wafers W to and from the cooling plate CP is carried out in one transport step of the first main transport mechanism 10A (see transport step (2) of the first main transport mechanism 10A shown in FIG. 10).

Upon completion of the transfer of wafers W to and from the cooling plate CP, the first main transport mechanism 10A vertically moves and swings together the unloaded holding arm 10a and the holding arm 10b holding the cooled wafer W to a position opposed to a predetermined one of the antireflection film coating modules 8. Usually, a prior-treated wafer W is present in this antireflection film coating module 8. Thus, the unloaded holding arm 10a is first advanced to pick up the treated wafer W from the spin chuck 11 in the antireflection film coating module 8. Then, the holding arm 10b holding the wafer W is advanced to place the wafer W on the spin chuck 11. The wafer W placed on the spin chuck 11 is coated with antireflection film while the main transport mechanism 10A performs other transport operations. The transfer of wafers W to and from the spin chuck 11 corresponds to transport step (3) of the first main transport mechanism 10A shown in FIG. 10. The "BARC" in FIG. 10 indicates the antireflection film coating module 8.

Upon completion of the transfer of wafers W to and from the spin chuck 11, the first main transport mechanism 10A vertically moves and swings together the holding arm 10a holding the wafer W coated with antireflection film and the holding arm 10b holding no wafer W to a position opposed to a predetermined heating plate HP. Usually, a prior-treated wafer W is present also on this heating plate HP. Thus, the unloaded holding arm 10b is first advanced to pick up the heated wafer W from the heating plate HP. Then, the holding arm 10a is advanced to place the wafer W to be treated on the heating plate HP. The wafer W placed on the heating plate HP is heat-treated to have superfluous solvent removed from the antireflection film on the wafer W while the main transport mechanism 10A performs other transport operations. The transfer of wafers W to and from the heating plate HP corresponds to transport step (4) of the first main transport mechanism 10A shown in FIG. 10.

Upon completion of the transfer of wafers W to and from the heating plate HP, the first main transport mechanism 10A vertically moves and swings together the unloaded holding arm 10a and the holding arm 10b holding the heated wafer W to a position opposed to one of the water-cooled cooling plates WCP installed on the partition 13. As in the cases noted above, the unloaded holding arm 10a is first advanced to pick up a treated wafer W from the cooling plate WCP. Then, the holding arm 10b is advanced to place the wafer W on the cooling plate WCP. The wafer W placed on the cooling plate WCP is roughly cooled while the main transport mechanism 10A performs other transport operations. The transfer of wafers W to and from the cooling plate WCP corresponds to transport step (5) of the first main transport mechanism 10A shown in FIG. 10.

Upon completion of the transfer of wafers W to and from the cooling plate WCP, the first main transport mechanism 10A raises together the holding arm 10a holding the roughly cooled wafer W and the unloaded holding arm 10b to a position opposed to the substrate rests PASS3 and PASS4 arranged above the cooling plates WCP. The holding arm 10a is advanced to place the wafer W on the upper, substrate feeding rest PASS3. Usually, the lower, substrate returning rest PASS4 is holding a developed wafer W sent thereto from the developing cell C4 through the resist film forming cell C3. After slightly lowering the holding arms 10a and 10b, the holding arm 10b is advanced to pick up the developed wafer W from the substrate rest PASS4.

The transfer of wafers W to and from the substrate rests PASS3 and PASS4 corresponds to the transport step (6+α) of the first main transport mechanism 10A shown in FIG. 10. As noted hereinbefore, "α" represents the brief part of the transport step for slightly raising and lowering the holding arms 10a and 10b. Thus, the transport step (6+α) may be regarded as one transport step.

The first main transport mechanism 10A of the antireflection film forming cell C2 repeats the transport step (1+α) through transport step (6+α) described above. A total of the transport step (1+α) through transport step (6+α) makes approximately six transport steps of the first main transport mechanism 10A. Assuming that one transport step takes four seconds, the first main transport mechanism 10A completes one cycle of substrate transport in about 24 seconds. In other words, the antireflection film forming cell C2 feeds one wafer W every 24 seconds (i.e. 150 wafers per hour) to the next, resist film forming cell C3.

Operation of the resist film forming cell C3 (resist film forming block 3) will be described. After the wafer W coated with antireflection film is placed on the substrate rest PASS3, as shown in FIG. 10, the second main transport mechanism 10B of cell C3 places a developed wafer W held by one holding arm 10b on the substrate rest PASS4. Then, the second main transport mechanism 10B loads the wafer W from substrate rest PASS3 on the holding arm 10a. The transfer of wafers W to and from the substrate rests PASS3 and PASS4 is indicated by transport step (1+α) of the second main transport mechanism 10B in FIG. 10. As noted hereinbefore, "α" represents a negligible time, and the transport step (1+α) may be regarded as one transport step.

Upon completion of the transfer of wafers W to and from the substrate rests PASS3 and PASS4, the second main transport mechanism 10B moves the holding arm 10a holding the wafer W and the holding arm 10b holding no wafer W to a position opposed to a predetermined cooling plate CP of the resist film heat-treating modules 16. The unloaded holding arm 10b is first advanced to pick up a cooled wafer W from the cooling plate CP. Then, the holding arm 10a is advanced to place the wafer W to be treated on the cooling plate CP. The transfer of wafers W to and from the cooling plate CP corresponds to transport step (2) of the second main transport mechanism 10B shown in FIG. 10.

Upon completion of the transfer of wafers W to and from the cooling plate CP, the second main transport mechanism 10B moves the unloaded holding arm 10a and the holding arm 10b holding the cooled wafer W to a position opposed to a predetermined one of the resist film coating modules 15. The unloaded holding arm 10a is first advanced to pick up a treated wafer W from the spin chuck 17 in the resist film coating module 15. Then, the holding arm 10b holding the wafer W is advanced to place the wafer W on the spin chuck 17. The wafer W placed on the spin chuck 17 is coated with resist film while the main transport mechanism 10B performs other transport operations. The transfer of wafers W to and from the spin chuck 17 corresponds to transport step (3) of the second main transport mechanism 10B shown in FIG. 10. The "PR" in FIG. 10 indicates the resist film coating module 8.

Upon completion of the transfer of wafers W to and from the spin chuck 17, the second main transport mechanism 10B moves the holding arm 10a holding the wafer W coated with resist film and the holding arm 10b holding no wafer W to a position opposed to a predetermined heating module PHP with temporary substrate deposit 19. The unloaded holding arm 10b is first advanced to pick up a treated wafer W from the temporary substrate deposit 19 of the heating module PHP. Then, the holding arm 10a is advanced to place the wafer W to be treated on the temporary substrate deposit 19. While the main transport mechanism 10B performs other transport operations, the local transport mechanism 20 transfers the wafer W placed on the temporary substrate deposit 19 to the heating plate HP in the heating module PHP for heat treatment. The wafer W heat-treated on the heating plate HP is returned to the temporary substrate deposit 19 by the same local transport mechanism 20. While being returned to the temporary substrate deposit 19 as held by the holding plate 24 of the local transport mechanism 20, the wafer W is cooled by the cooling mechanism in the holding plate 24. The transfer of wafers W to and from the heating module PHP corresponds to transport step (4) of the second main transport mechanism 10B shown in FIG. 10.

Upon completion of the transfer of wafers W to and from the heating module PHP, the second main transport mechanism 10B moves the unloaded holding arm 10a and the holding arm 10b holding the heated wafer W to a position opposed to a cooling plate CP of the resist film heat-treating modules 16. The unloaded holding arm 10a is advanced to pick up a cooled wafer W from the cooling plate CP. Then, the holding arm 10b is advanced to place the wafer W to be treated on the cooling plate CP. The transfer of wafers W to and from the cooling plate CP corresponds to transport step (5) of the second main transport mechanism 10B shown in FIG. 10.

Upon completion of the transfer of wafers W to and from the cooling plate CP, the second main transport mechanism 10B moves the holding arm 10a holding the cooled wafer W and the unloaded holding arm 10b to a position opposed to the substrate rests PASS5 and PASS6. The holding arm 10a is advanced to place the wafer W on the upper, substrate feeding rest PASS5, and the holding arm 10b is advanced to pick up a developed wafer W from the lower, substrate returning rest PASS6.

The transfer of wafers W to and from the substrate rests PASS5 and PASS6 corresponds to the transport step (6+α) of the second main transport mechanism 10B shown in FIG. 10. The transport step (6+α) is regarded as one transport step.

The second main transport mechanism 10B of the resist film forming cell C3 repeats the transport step (1+α) through transport step (6+α) described above. A total of the transport step (1+α) through transport step (6+α) makes approximately six transport steps of the second main transport mechanism 10B as in the case of the first main transport mechanism 10A. Thus, the second main transport mechanism 10B completes the same one cycle of substrate transport (in about 24 seconds in this embodiment) as does the first main transport mechanism 10A. In other words, the resist film forming cell C3 feeds one wafer W every 24 seconds (i.e. 150 wafers per hour) to the next, developing cell C4.

Operation of the developing cell C4 will be described. After the wafer W coated with resist film is placed on the substrate rest PASS5, as shown in FIG. 10, the third main transport mechanism 10C of cell C4 places a developed wafer W held by one holding arm 10b on the substrate rest PASS6. Then, the third main transport mechanism 10C loads the wafer W from the substrate rest PASS5 on the holding arm 10a. The transfer of wafers W to and from the substrate rests PASS5 and PASS6 is indicated by transport step (1+α) of the third main transport mechanism 10C in FIG. 10.

Upon completion of the transfer of wafers W to and from the substrate rests PASS5 and PASS6, the third main transport mechanism 10C moves the holding arm 10a holding the wafer W and the holding arm 10b holding no wafer W to a position opposed to the substrate rests PASS7 and PASS8 included in the vertical arrangement of heat-treating modules 31. The holding arm 10a is advanced to place the wafer W coated with resist film on the upper, substrate feeding rest PASS7. Then, the holding arm 10b is advanced to pick up a wafer W having undergone post-exposure heating treatment from the lower, substrate returning rest PASS8. The transfer of wafers W to and from the substrate rests PASS7 and PASS8 is indicated by transport step (2+α) of the third main transport mechanism 10C shown in FIG. 10.

Upon completion of the transfer of wafers W to and from the substrate rests PASS7 and PASS8, the third main transport mechanism 10C moves the unloaded holding arm 10a and the holding arm 10b holding the exposed and heat-treated wafer W to a position opposed to a predetermined cooling plate CP of the heat-treating modules 31. The unloaded holding arm 10a is first advanced to pick up a cooled wafer W from the cooling plate CP. Then, the holding arm 10b is advanced to place the wafer W to be treated on the cooling plate CP. The transfer of wafers W to and from the cooling plate CP corresponds to transport step (3) of the third main transport mechanism 10C shown in FIG. 10.

Upon completion of the transfer of wafers W to and from the cooling plate CP, the third main transport mechanism 10C moves the holding arm 10a holding the cooled wafer W and the unloaded holding arm 10b to a position opposed to a predetermined one of the developing modules 30. The unloaded holding arm 10b is first advanced to pick up a treated wafer W from the spin chuck 32 in the developing module 30. Then, the holding arm 10a holding the wafer W is advanced to place the wafer W on the spin chuck 32. The wafer W placed on the spin chuck 32 is developed while the main transport mechanism 10C performs other transport operations. The transfer of wafers W to and from the spin chuck 32 corresponds to transport step (4) of the third main transport mechanism 10C shown in FIG. 10. The "SD" in FIG. 10 indicates the developing module 30.

Upon completion of the transfer of wafers W to and from the spin chuck 32, the third main transport mechanism 10C moves the unloaded holding arm 10a and the holding arm 10b holding the developed wafer W to a position opposed to a predetermined heating plate HP of the developing modules 31. The unloaded holding arm 10a is first advanced to pick up a treated wafer W from the heating plate HP. Then, the holding arm 10b is advanced to place the wafer W to be treated on the heating plate HP. The transfer of wafers W to and from the heating plate HP corresponds to transport step (5) of the third main transport mechanism 10C shown in FIG. 10.

Upon completion of the transfer of wafers W to and from the heating plate HP, the third main transport mechanism 10C moves the holding arm 10a holding the heated wafer W and the unloaded holding arm 10b to a position opposed to the water-cooled cooling plates WCP installed on the partition 13 adjacent the resist film forming cell C3. The unloaded holding arm 10b is advanced to pick up a treated wafer W from the cooling plate WCP, and the holding arm 10a is advanced to place the wafer W to be treated on the cooling plate WCP. The transfer of wafers W to and from the cooling plate WCP corresponds to transport step (6) of the third main transport mechanism 10C shown in FIG. 10.

The third main transport mechanism 10C of the developing cell C4 repeats the transport step (1+α) through transport step (6) described above. A total of the transport step (1+α) through transport step (6) makes approximately six transport steps of the third main transport mechanism 10C as in the case of the first and second main transport mechanisms 10A and 10B. Thus, the third main transport mechanism 10C completes the same one cycle of substrate transport (in about 24 seconds in this embodiment) as do the first and second main transport mechanisms 10A and 10B. In other words, the developing cell C4 feeds one wafer W every 24 seconds (i.e. 150 wafers per hour) to the next, post-exposure heating cell C5.

Operation of the post-exposure heating cell C5 will be described. After the wafer W coated with resist film is placed on the substrate rest PASS7, as shown in FIG. 10, the fourth main transport mechanism 10D of cell C5 places a developed and heated wafer W held by the holding arm 10b on the substrate rest PASS8. Then, the fourth main transport mechanism 10D loads the wafer W from the substrate rest PASS7 on the holding arm 10a. The transfer of wafers W to and from the substrate rests PASS7 and PASS8 is indicated by transport step (1+α) of the fourth main transport mechanism 10D in FIG. 10.

Upon completion of the transfer of wafers W to and from the substrate rests PASS7 and PASS8, the fourth main transport mechanism 10D moves the holding arm 10a holding the wafer W and the holding arm 10b holding no wafer W to a position opposed to a predetermined one of the edge exposing modules EEW. The unloaded holding arm 10b is first advanced to pick up an edge-exposed wafer W from the spin chuck 36 in the edge exposing module EEW. Then, the holding arm 10a holding the wafer W is advanced to place the wafer W to be treated on the spin chuck 36. The wafer W placed on the spin chuck 36 has peripheries thereof exposed while the main transport mechanism 10D performs other transport operations. The transfer of wafers W to and from the spin chuck 36 corresponds to transport step (2) of the fourth main transport mechanism 10D shown in FIG. 10.

Upon completion of the transfer of wafers W to and from the spin chuck 36, the fourth main transport mechanism 10D moves the unloaded holding arm 10a and the holding arm 10b holding the edge-exposed wafer W to a position opposed to a predetermined cooling plate CP of the heat-treating modules 31. The unloaded holding arm 10a is advanced to pick up a cooled wafer W from the cooling plate CP, and the holding arm 10b is advanced to place the edge-exposed wafer W on the cooling plate CP. The transfer of wafers W to and from the cooling plate CP corresponds to transport step (3) of the fourth main transport mechanism 10D shown in FIG. 10.

Upon completion of the transfer of wafers W to and from the cooling plate CP, the fourth main transport mechanism 10D moves the holding arm 10a holding the cooled wafer W and the unloaded holding arm 10b to a position opposed to the substrate rests PASS9 and PASS10. Then, the holding arm 10a is advanced to place the wafer W on the upper, substrate feeding rest PASS9, and the holding arm 10b is advanced to pick up a wafer W exposed in the exposing apparatus STP from the lower, substrate returning rest PASS10. The transfer of wafers W to and from the substrate rests PASS9 and PASS10 corresponds to transport step (4+α) of the fourth main transport mechanism 10D shown in FIG. 10.

Upon completion of the transfer of wafers W to and from the substrate rests PASS9 and PASS10, the fourth main transport mechanism 10D moves the unloaded holding arm 10a and the holding arm 10b holding the exposed wafer W to a position opposed to a predetermined heating module PHP, with a temporary substrate deposit, of the heat-treating modules 31. The unloaded holding arm 10a is first advanced to pick up an exposed and heated wafer W from the heating module PHP (more particularly from the temporary substrate deposit 19). Then, the holding arm 10b is advanced to place the exposed wafer W in the heating module PHP (more particularly in the temporary substrate deposit 19). While the main transport mechanism 10D performs other transport operations, the local transport mechanism 20 transfers the wafer W placed on the temporary substrate deposit 19 to the heating plate HP for heat treatment. Subsequently, the heated wafer W is returned to the temporary substrate deposit 19 by the same local transport mechanism 20. The transfer of wafers W to and from the heating module PHP corresponds to transport step (5) of the fourth main transport mechanism 10D shown in FIG. 10.

The fourth main transport mechanism 10D of the post-exposure heating cell C5 repeats the transport step (1+α) through transport step (5) described above. A total of the transport step (1+α) through transport step (5) makes approximately five transport steps of the fourth main transport mechanism 10D, which are one less than the transport steps shared by the first to third main transport mechanisms 10A-10C. In the post-exposure heating cell C5 only, the fourth main transport mechanism 10D is operable in cycles of 20 seconds when one transport step takes four seconds. However, since the other, first to third main transport mechanisms 10A-10C operate in cycles of 24 seconds, the post-exposure heating cell C5, after all, feeds one wafer W every 24 seconds (i.e. 150 wafers per hour) to the next, interface cell C6, i.e. at the same rate as the other cells.

Operation of the interface cell C6 will be described. After the edge-exposed wafer W is placed on the substrate rest PASS9, the transport mechanism 35 of the interface cell C6 receives the wafer W from the substrate rest PASS9, and passes the wafer W on to the adjoining exposing apparatus STP. Furthermore, the interface's transport mechanism 35 receives an exposed wafer W from the exposing apparatus STP, and places this wafer W on the substrate returning rest PASS10. The interface's transport mechanism 35 repeats this substrate transport operation.

In the substrate treating apparatus in this embodiment, as described above, the heating modules PHP are arranged in the developing block 4 in the main body of the treating apparatus for heating exposed wafers W before development. Thus, the interface block 5 is interposed between the heating modules PHP and the exposing apparatus STP, to separate the heating modules PHP from the exposing apparatus STP. This arrangement can avoid the adverse thermal influence of the heating modules PHP being exerted on the exposing apparatus STP. Further, the transfer of wafers W to and from the heating modules PHP is carried out by the transport mechanism (the fourth main transport mechanism 10D in this embodiment) disposed in the interface block 5. Exposed wafers W may therefore be promptly transported to and heated in the heating modules PHP. As a result, variations in the time before heating the exposed wafers W are suppressed, thereby improving the accuracy of patterning of the photoresist developed.

The heating modules PHP for post-exposure heating have the local transport mechanism 20 for exclusive use in transporting wafers W from the heating plate HP to the temporary substrate deposit 19. Each heated wafer W may be promptly fetched from the heating plate HP and transported to the temporary substrate deposit 19. That is, the heated wafer W is not unduly kept still on the heating plate HP, variations in the post-exposure heating time may also be suppressed. Moreover, the local transport mechanism 20 in the embodiment has the function for cooling the wafer W, the wafer W fetched from the heating plate HP is cooled while being transported to the temporary substrate deposit 19. That is, the wafer W is cooled as soon as it is fetched from the heating plate 19, and therefore the post-exposure heating time may be managed with increased strictness. The accuracy of patterning of the photoresist may also be further improved.

It is of course possible to arrange a cooling plate in the temporary substrate deposit 19 instead of providing the local transport mechanism 20 with the function for cooling wafers W. In any case, a heating device for heating wafers W after exposure and a cooling device for cooling the wafers W after heating should, preferably, be arranged adjacent each other, so that the heated wafers W may be promptly transferred to the cooling device.

The exposing apparatus STP or developing cell C4 may become incapable of accepting wafers W due to some fault. Operation on such an occasion will be described nest.

Assume that the exposing apparatus STP has become incapable of accepting wafers W. In this case, the transport mechanism 35 of the interface cell C6 picks up wafers W from the substrate rest PASS9, and temporarily stores these wafers W in the feed buffer SBF. Treatment is continued only for the number of wafers W storable in the buffer SBF. When the buffer SBF is expected to accommodate no more wafers W, the operation for fetching wafers W from the indexer cell C1 is stopped. When the exposing apparatus STP has become ready to accept wafers W, the interface's transport mechanism 35 fetches the wafers W from the buffer SBF in the order in which the wafers W were stored, and passes the wafers W to the exposing apparatus STP. Thereafter the apparatus resumes normal operations.

Assume that the developing cell C4 has become incapable of accepting wafers W. In this case, the interface's transport mechanism 35 passes exposed wafers W successively returned from the exposing apparatus STP to the substrate rest PASS10 as usual. The fourth main transport mechanism 10D of the post-exposure heating cell C5 passes the exposed wafers W to the heating modules PHP as usual. The fourth main transport mechanism 10D temporarily stores the wafers W having undergone the post-exposure heat treatment in the heating modules PHP, in the substrate return buffer RBF in the cell C5, instead of placing these wafers W on the substrate rest PASS8. Similar post-exposure heating is carried out for the number of wafers W already loaded into the exposing apparatus STP, and these wafers W are thereafter stored in the substrate return buffer RBF. When the developing cell C4 has become ready to accept wafers W, the fourth main transport mechanism 10D fetches the wafers W from the buffer RBF in the order in which the wafers W were stored, and passes the wafers W to the substrate rest PASS8. Thereafter the apparatus resumes normal operations.

In the apparatus described above, the interface block 5 includes the feed buffer SBF and return buffer RBF. Even when the exposing apparatus STP or developing modules 30 become(s) incapable of accepting wafers W, the wafers W may be continuously processed to a certain extent, to realize an improved working efficiency of the substrate treating apparatus. In particular, the wafers W returned from the exposing apparatus STP are storable in the buffer RBF after being heated in the heating modules PHP. Thus, the wafers W returned from the exposing apparatus STP are never left untreated for a long time, without receiving post-exposure heating treatment. As a result, the quality of the chemically amplified photoresist may be maintained to dispense with a reclaiming treatment.

The apparatus in this embodiment provides the interface block 5 with the two transport mechanisms, i.e. the fourth main transport mechanism 10D and interface's transport mechanism 35. The fourth main transport mechanism 10D transfers wafers W between the heating modules PHP for post-exposure heating and the return buffer RBF. The interface's transport mechanism 35 transfers the wafers W between the exposing apparatus STP and the feed buffer SBF. Thus, each transport mechanism can transport wafers W with an allowance of time. As a result, wafers W may be promptly transported to the heating modules PHP for post-exposure heating. This suppresses variations in the time before heating wafers W after exposure, thereby improving the accuracy of patterning of the photoresist.

This invention is not limited to the embodiment described above, but may be modified as follows, for example:

(1) In the foregoing embodiment, the main body of the treating apparatus includes both the heating device for heating wafers W after exposure and the cooling device for cooling the wafers W after heating (specifically, the heating modules PHP arranged in the developing block 4). However, the main body of the treating apparatus may include only the heating device, with the cooling device disposed in the interface block 5.

(2) In the foregoing embodiment, the interface block 5 includes two transport mechanisms (specifically, the fourth main transport mechanism 10D and interface's transport mechanism 35) to transport exposed wafers W promptly to the heating modules PHP in the developing block 4. The interface block 5 may include only one substrate transport mechanism (e.g. the interface's transport mechanism 35) where the substrate transport mechanism is quick enough to provide an allowance of time. This substrate transport mechanism may be used to transfer wafers W to and from the heating modules PHP and exposing apparatus STP.

(3) In the foregoing embodiment, the main transport mechanisms 10A-10C are arranged in the respective treating blocks 2-4 in the main body of the treating apparatus. Instead, wafers W may be transported by a substrate transport mechanism common to the treating blocks 2-4. In this case, the common substrate transport mechanism may be constructed horizontally movable along the treating blocks 2-4.

(4) In the foregoing embodiment, the substrate treating apparatus is divided into a plurality of controlled units (cells C1-C6), with a view to facilitating control. Instead, each of the blocks 1-5 of the apparatus may form a unit of control, or these blocks 1-5 may be adapted operable under centralized control by a single controller.

As described above, this invention is suitable for a substrate treating apparatus that performs a series of treatments of substrates such as semiconductor wafers, glass substrates for liquid crystal displays, glass substrates for photomasks, and substrates for optical disks.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for performing a required treatment of substrates, comprising:
    a main body of the treating apparatus including a developing section for developing the substrates; and
    an interface section for transferring the substrates between said main body of the treating apparatus and an exposing apparatus which is an external apparatus;
    wherein said developing section comprises developing modules, heat-treating modules, and a main transport mechanism for transferring the substrates to and from said developing modules and said heat-treating modules;
    said heat-treating modules comprise heating modules for heating exposed substrates before development;
    said heating modules are disposed in said main body of the treating apparatus, adjacent said interface section, and remote from said exposing apparatus, said heating modules including a heating plate for supporting and heating the substrates, cooling means for cooling heated substrates heated by said heating plate, a temporary substrate deposit for holding cooled substrate, and a local transport mechanism for exclusive use in transporting the substrates from said heating plate to said temporary substrate deposit; and
    said interface section includes a substrate transport mechanism for transferring the substrates directly to said heating modules.

2. A substrate treating apparatus as defined in claim 1, wherein said heating plate and said cooling means are arranged adjacent each other and in said main body of the treating apparatus.

3. A substrate treating apparatus for performing a required treatment of substrates, comprising:
   a main body of the treating apparatus including a developing section for developing the substrates;
   an interface section for transferring the substrates between said main body of the treating apparatus and an exposing apparatus which is an external apparatus;
   heating modules for heating exposed substrates before development; and
   cooling means for cooling the substrates heated by said heating modules;
   wherein said heating modules are disposed in said main body of the treating apparatus, and
   said heating modules includes a heating plate for supporting and heating the substrates, a temporary substrate deposit adjacent to said heating plate for holding cooled substrates, and a local transport mechanism for exclusive use in transporting the substrates from said heating plate to said temporary substrate deposit; and
   wherein said interface section includes a substrate transport mechanism for transferring the substrates to said temporary substrate deposit in said heating modules and transferring the cooled substrates held on said temporary substrate deposit to said developing section.

4. A substrate treating apparatus as defined in claim 3, wherein said cooling means is provided for said local transport mechanism.

5. A substrate treating apparatus as defined in claim 4, wherein said local transport mechanism includes a holding plate, said cooling means being provided for said holding plate.

6. A substrate treating apparatus as defined in claim 3, wherein said cooling means is provided for said temporary substrate deposit.

7. A substrate treating apparatus as defined in claim 3, wherein said heating plate is enclosed in a housing defining an opening for allowing said local transport mechanism to load and unload the substrates on/from said heating plate, said opening being located in a side remote from a side accessed by a main transport mechanism for transporting the substrates to said developing modules included in said developing section.

8. A substrate treating apparatus as defined in claim 1, wherein said interface section includes a feed buffer for temporarily storing the substrates to be exposed, when said exposing apparatus is incapable of accepting the substrates.

9. A substrate treating apparatus as defined in claim 1, wherein said interface section includes a return buffer for temporarily storing the substrates heated and cooled by said heating modules after exposure, when said developing section is incapable of accepting the substrates.

10. A substrate treating apparatus for performing a required treatment of substrates, comprising:
    a main body of the treating apparatus including a developing section for developing the substrates;
    an interface section for transferring the substrates between said main body of the treating apparatus and an exposing apparatus which is an external apparatus;
    heating modules for heating exposed substrates before development; and
    cooling means for cooling the substrates heated by said heating modules;
    wherein said heating modules are disposed in said main body of the treating apparatus, and said heating modules include a heating plate for supporting and heating the substrate, a temporary substrate deposit adjacent to said heating plate for holding cooled substrates, and a local transport mechanism for exclusive use in transporting the substrates from said heating plate to said temporary substrate deposit; and
    wherein said interface section includes a feed buffer for temporarily storing the substrates to be exposed, when said exposing apparatus is incapable of accepting the substrates, a return buffer for temporarily storing the substrates heated and cooled by said heating modules after exposure, when said developing section is incapable of accepting the substrates, and two substrate transport mechanisms;
    one of said substrate transport mechanisms included in said interface section is arranged at least to transfer the substrates to said heating modules and said return buffer; and
    the other of said substrate transport mechanisms included in said interface section is arranged at least to transfer the substrates to said exposing apparatus and said feed buffer.

11. A substrate treating apparatus as defined in claim 3, wherein said heating modules are disposed in said main body adjacent said interface section, and remote from said exposing apparatus, and said interface section includes a substrate transport mechanism for transferring the substrates directly to said heating modules.

12. A substrate treating apparatus as defined in claim 10, wherein said heating modules are disposed in said main body adjacent said interface section, and remote from said exposing apparatus, and wherein one of said two substrate transport mechanisms included in said interface section transfers the substrates directly to said heating modules.

* * * * *